United States Patent [19]
Jost et al.

[11] 3,931,568
[45] Jan. 6, 1976

[54] EFFICIENT BIASING SCHEME FOR MICROWAVE DIODES

[75] Inventors: Walter R. Jost, Richfield, Minn.; Stuart S. Horwitz, Baltimore, Md.

[73] Assignee: The United States of America as represented by the Secretary of the Army, Washington, D.C.

[22] Filed: May 2, 1974

[21] Appl. No.: 466,440

[52] U.S. Cl................ 323/25; 307/235 R; 307/255; 323/38
[51] Int. Cl.² ........................................ H03K 17/00
[58] Field of Search .......... 307/242, 255, 262, 235, 307/313; 321/54, 56, 58; 323/106, 119, 121, 122, 35, 38, 25, 23, 3; 328/155

[56] References Cited
UNITED STATES PATENTS

| | | | |
|---|---|---|---|
| 3,087,090 | 4/1963 | Konopa................ | 307/255 X |
| 3,292,005 | 12/1966 | Lee...................... | 307/255 |
| 3,374,366 | 3/1968 | Kleinberg............. | 307/255 X |
| 3,514,633 | 5/1970 | Schroeder............ | 307/235 |
| 3,633,051 | 1/1972 | Press et al............ | 307/242 X |
| 3,654,490 | 4/1972 | Kan..................... | 307/262 X |
| 3,710,145 | 1/1973 | Williamson et al... | 307/262 X |

Primary Examiner—Gerald Goldberg
Attorney, Agent, or Firm—Lawrence A. Neureither; Jack W. Voigt; Robert C. Sims

[57] ABSTRACT

Drivers (PNP transistors) are switched to ground by NPN transistors which are triggered by logic inputs. The drivers are connected in series with diodes so as to bias the diode to an on or off condition.

2 Claims, 2 Drawing Figures 3,931,568

EFFICIENT BIASING SCHEME FOR MICROWAVE DIODES

SUMMARY OF THE INVENTION

A plurality of series fed switched line diodes have their switching transistors controlled by drive transistors. The switching transistors are PNP transistors and the drive transistors are NPN transistors. In this way the switching transistor can be controlled by the opening or closing of its base circuit by the drive transistor which is connected in series therewith. The drive transistor is a NPN transistor and receives its control from a logic input. The logic "1" will cause the drive transistor to turn on; therefore completing a circuit path from the base of the switching transistor to ground. This will turn on the switching transistor. If the logic input is a logic "0" the drive transistor will be turned off and will open circuit the path from the base of the switching transistor to ground. This will turn off the switching transistor. By the use of this biasing scheme, the amount of power dissipated will be small compared to other biasing schemes.

DESCRIPTION OF THE PREFERRED EMBODIMENT

This disclosure describes an improved method to bias series-fed switched line diodes. In order to be able to cover a large amount of volume and also to keep the amount of original RF power required to a reasonable level but still obtain a large amount of equivalent peak power, a phased-array radar will have many, many modules. Because of the large number of modules required, it is highly desirable to keep all quantities such as power dissipation, size, weight, volume, number of parts, and cost per module as low as possible. The series-fed diode goes a long way toward lowering the dissipation of the diodes and diode drivers in the module, in that only one current is generated instead of as many currents as there are bits.

Figure 1:
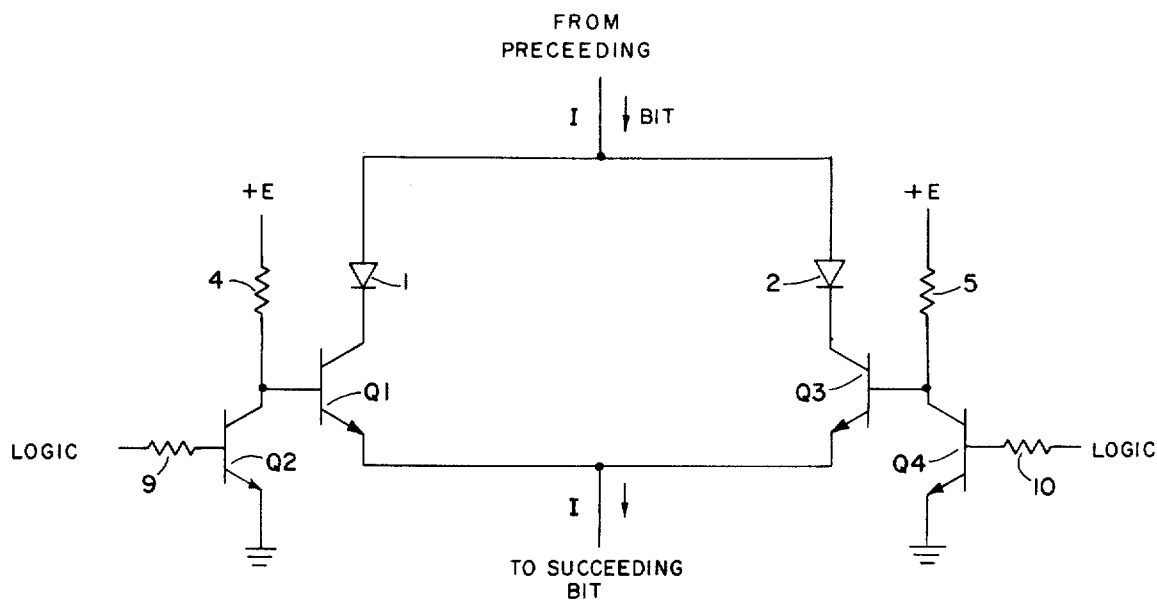
FIG. 1 shows a circuit diagram of a biasing scheme.

The DC circuit for the method to bias the diodes is shown in FIG. 1. Each of the diodes 1 and 2 represents 2 parallel PIN diodes. Transistor Q1 is turned on and saturated by Q2's turning off, and Q3 is held off by Q4's being on and bringing Q3's base down to ground. To reverse the state of the bit, the logic inputs to Q2 and Q4 are reversed, thus steering the common current through the other pair of diodes. Although this configuration offers a significant power savings over the conventional approach wherein an independent current is generated and switched to the correct half of the bit for each bit, it is not optimum because there is a significant amount of power dissipated in the collector resistors 4 and 5 of transistors Q2 and Q4. In order to drive enough base current to saturate Q1 and Q3, the collector resistors will be rather small. Unfortunately, the smaller the resistor the more power it dissipates for a given power supply +E.

The value of E is (for example) 10 volts. To provide enough drive current to saturate the switching transistors Q1 and Q3 in the current path, the collector resistors 4 and 5 are 2000 ohms. This means that there were ($10^2/2000 - 0.05$) 50 milliwatts dissipated in the collector resistor. This is a DC dissipation because one or the other of the switching transistors is off all the time, and there is one such dissipating collector resistor for each bit.

Figure 2:
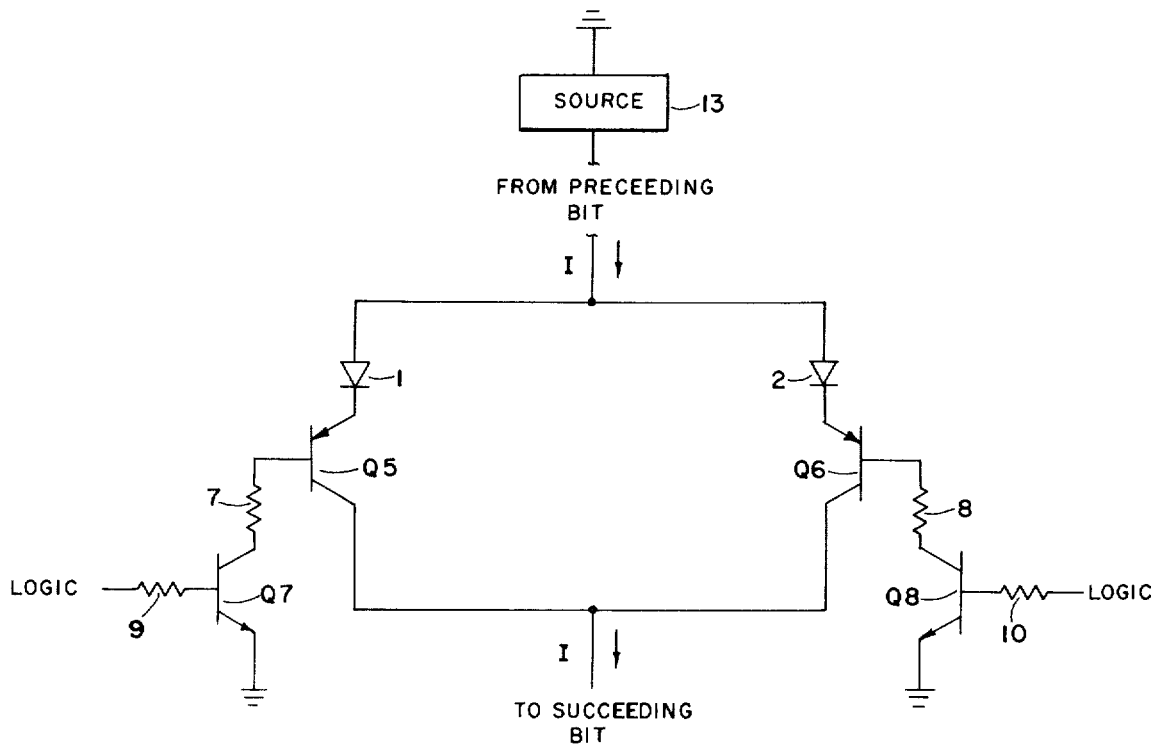
FIG. 2 shows a circuit diagram of an improved biasing scheme embodying the present invention.

As can be seen in FIG. 2, the switching transistors Q5 and Q6 have been changed from NPN to PNP transistors. In order to turn the switch off now, all that is required is to open the base. In order to open the base, all that is required is to turn the drive transistors Q7 and Q8 off. Since drive transistors are NPN (as before), this merely means returning there base to ground. Since the module must have some logic, returning the base of the driving NPN to a zero logic output is adequate to turn the NPN off, and to open the PNP, thus forcing the diode current to seek another path, i.e. the other side of the bit. The PNP transistor Q5 or Q6 is turned on by turning the NPN drive transistor Q7 or Q8 on.

The base resistors 7 and 8 in the PNP must be of such a value to saturate the PNP when the NPN turns on and saturates. The base current from the PNP switch Q5 or Q6 is the only current flowing in the base resistor 7 or 8, and the dissipation can be made small compared to the 50 milliwatts the collector resistor dissipates in FIG. 1. The base resistors 9 and 10 in the NPN drive transistors Q7 and Q8 also need not dissipate much power in that its emitter is grounded and it is a high gain transistor requiring little base drive to saturate it. In any event, this part of the circuit is identical to FIG. 1, and this resistor's dissipation is also identical.

FIG. 2 only shows one bit of the scheme. A large number of modules containing the circuit of this bit will be used in the practical application of the present invention. These modules will be connected in series as indicated by FIG. 2. A source of DC power 13 is converted to the first bit and to ground so as to provide a voltage potential across the various elements. Logic outputs may be derived from the circuit by connections (not shown) to points between the diodes and the switching transistors. These connections will be buffered by high impedance amplifiers so as not to drain the circuit.

We claim:

1. A circuit comprising a first transistor having emitter, collector and base elements; supply means connected to said first transistor so as to provide a voltage potential across its elements; switching means connected between the supply means and the base element of said transistor so as to control the operation of said transistor; said switching means is a second transistor having emitter, collector and base elements; the collector of said second transistor being connected to the base of said first transistor; the emitter of said second transistor being connected to said supply means; a control voltage input connected between the base and emitter of said second transistor; said first transistor is a PNP transistor; said second transistor is a NPN transistor; said supply voltage is a DC supply voltage; a third PNP transistor having emitter, collector base elements; first and second diodes; said first diode being connected in series with an emitter collector path of said first transistor; said second diode being connected in series with an emitter collector path of said third transistor; the combination of said first diode and said first transistor collector emitter path being connected in parallel with the combination circuit of said second diode and said third transistor emitter collector path; a fourth NPN transistor having emitter collector and base elements; said fourth transistor having its emitter collector path connected in series between the base of said third transistor and said supply means; said control voltage input being a binary logic control voltage input; and one side of the control voltage input being connected to the base circuit of said second transistor and the other side of the control voltage input being connected to the base circuit of said fourth transistor.

2. A circuit as set forth in claim 1 further comprising a plurality of transistors and diodes connected as said forth above; each of these circuits being connected in series with each other between the supply voltage means.

* * * * *